US010554173B2

United States Patent
Matsuda (10) Patent No.: US 10,554,173 B2
(45) Date of Patent: Feb. 4, 2020

(54) VOLTAGE CONTROLLED OSCILLATOR AND PLL CIRCUIT

(71) Applicant: SOCIONEXT INC., Kanagawa (JP)

(72) Inventor: Atsushi Matsuda, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/965,215

(22) Filed: Apr. 27, 2018

(65) Prior Publication Data

US 2018/0248515 A1    Aug. 30, 2018

Related U.S. Application Data

(63) Continuation of application No. PCT/JP2016/060620, filed on Mar. 31, 2016.

(30) Foreign Application Priority Data

Nov. 18, 2015    (JP) .................................. 2015-225751

(51) Int. Cl.
*H03B 5/04*    (2006.01)
*H03L 7/099*    (2006.01)
(Continued)

(52) U.S. Cl.
CPC ............... *H03B 5/04* (2013.01); *H03B 5/124* (2013.01); *H03B 5/1206* (2013.01);
(Continued)

(58) Field of Classification Search
CPC ............. H03B 5/12; H03B 2200/0006; H03B 2200/0008; H03B 2200/004;
(Continued)

(56) References Cited

U.S. PATENT DOCUMENTS 7,170,358 B2    1/2007 Tsukizawa et al.
2003/0227340 A1    12/2003 Koo et al.
(Continued)

FOREIGN PATENT DOCUMENTS

EP    1 514 351 B1    11/2007
JP    2002-314414 A    10/2002
(Continued)

OTHER PUBLICATIONS

Marutani, M. et al., "An 18mW 90 to 770MHz Synthesizer with Agile Auto-Tuning for Digital TV-Tuners", 2006 IEEE International Solid-State Circuits Conference (ISSCC 2006), Feb. 6-9, 2006.
(Continued)

*Primary Examiner* — Arnold M Kinkead
(74) *Attorney, Agent, or Firm* — McDermott Will & Emery LLP (57) ABSTRACT

A first tuning circuit tunes an oscillation frequency by changing, based on a first control signal, capacitance values of variable capacitive elements connected in parallel to an inductor. A second tuning circuit switches capacitive elements in and out of parallel connection with the inductor by turning on and off a transistor based on a second control signal, to thereby tune the oscillation frequency. A switching circuit includes n-channel transistors whose drains are connected via resistor elements to the source or drain of the transistor and a power and whose sources are grounded, and changes a bias voltage of the second tuning circuit by turning on and off the n-channel transistors based on the second control signal.

6 Claims, 5 Drawing Sheets

(51) Int. Cl.
  *H03B 5/12* (2006.01)
  *H03L 7/093* (2006.01)
  *H03L 7/10* (2006.01)

(52) U.S. Cl.
  CPC ......... *H03B 5/1212* (2013.01); *H03B 5/1228* (2013.01); *H03L 7/093* (2013.01); *H03L 7/099* (2013.01); *H03L 7/10* (2013.01)

(58) Field of Classification Search
  CPC ...... H03B 5/1228; H03B 5/1206; H03B 5/04; H03L 7/18; H03L 7/0898; H03L 7/093; H03L 7/0992; H03L 7/10; H03L 7/199; H03L 2207/50; H03L 7/0802; H03L 7/081; H03L 7/099
  USPC ....................................... 331/167, 179, 177 V
  See application file for complete search history.

(56) References Cited

U.S. PATENT DOCUMENTS

| | | |
|---|---|---|
| 2007/0085620 A1 | 4/2007 | Ohkubo et al. |
| 2007/0247237 A1 | 10/2007 | Mohammadi |
| 2008/0136544 A1 | 6/2008 | Tang |
| 2008/0174379 A1* | 7/2008 | Chen .................... H03B 5/1228 331/177 V |
| 2009/0184771 A1 | 7/2009 | Barton et al. |
| 2010/0007427 A1 | 1/2010 | Tomita |
| 2010/0013567 A1 | 1/2010 | Tomita |
| 2010/0308932 A1* | 12/2010 | Rangarajan .......... H03B 5/1265 331/167 |
| 2012/0081188 A1 | 4/2012 | Liu et al. |
| 2013/0147566 A1* | 6/2013 | Voinigescu .......... H03B 5/1231 331/117 FE |
| 2013/0300477 A1 | 11/2013 | Ueda et al. |

FOREIGN PATENT DOCUMENTS

| | | |
|---|---|---|
| JP | 2005-529536 A | 9/2005 |
| JP | 2006-033803 A | 2/2006 |
| JP | 2006-060395 A | 3/2006 |
| JP | 2007-110504 A | 4/2007 |
| JP | 2007-158750 A | 6/2007 |
| JP | 2010-512722 A | 4/2010 |
| JP | 2012-090130 A | 5/2012 |
| JP | 2013-546228 A | 12/2013 |
| JP | 5668082 B2 | 2/2015 |
| WO | 03/105346 A1 | 12/2003 |
| WO | 2008/114455 A1 | 9/2008 |
| WO | 2012/048034 A2 | 4/2012 |

OTHER PUBLICATIONS

Sadhu, B. et al. "A Linearized, Low-Phase-Noise VCO-Based 25-GHz PLL With Autonomic Biasing", IEEE Journal of Solid-State Circuits, May 2013, vol. 48, No. 5, pp. 1138-1150, Apr. 2, 2013.
International Search Report dated Jun. 21, 2016 for PCT/JP2016/060620; with English translation.
Written Opinion of the International Searching Authority dated Jun. 21, 2016 for PCT/JP2016/060620; with partial translation of Vox No. V.
Office Action dated Oct. 29, 2019 for corresponding Japanese Patent Application No. 2015-225751; machine translation is attached.

* cited by examiner

VOLTAGE CONTROLLED OSCILLATOR AND PLL CIRCUIT

CROSS-REFERENCE TO RELATED APPLICATION

This application is a continuation application of International Application PCT/JP2016/060620 filed on Mar. 31, 2016 and designated the U.S., which is based upon and claims the benefit of priority of the prior Japanese Patent Application No. 2015-225751, filed on Nov. 18, 2015, the entire contents of which are incorporated herein by reference.

FIELD

The embodiments discussed herein are related to a voltage controlled oscillator and PLL circuit.

BACKGROUND

An LC resonant voltage controlled oscillator (VCO) in which variable capacitive elements and an inductor are connected in parallel is one kind of VCOs used in phase-locked loop (PLL) circuits. A conventionally known LC resonant VCO includes a coarse tuning circuit in order to expand the tuning range of the oscillation frequency of the VCO. The coarse tuning circuit enables capacitive elements to be switched in and out of parallel connection with the above-mentioned variable capacitive elements by causing a transistor to be turned on and off, to thereby tune the oscillation frequency.

See, for example, Japanese Laid-open Patent Publication Nos. 2006-33803, 2007-110504, and 2007-158750 and "An 18 mW 90 to 770 MHz synthesizer with agile auto-tuning for digital TV-tuners", ISSCC 2006/SESSION 11/RF BUILDING BLOCKS AND PLLS/11.1, pages 681-690.

To the source or drain of the transistor of the coarse tuning circuit, a bias voltage based on the on/off state of the transistor is applied in order to prevent damage to the transistor.

However, thermal noise increases with high on-resistance of transistors included in a circuit for generating the bias voltage. The thermal noise is transferred via the capacitive elements of the coarse tuning circuit to the output terminal of the VCO, which then increases the output noise.

SUMMARY

According to an aspect, there is provided a voltage controlled oscillator including: an inductor; a first tuning circuit configured to include a variable capacitive element connected in parallel to the inductor, and receive a first control signal and tune an oscillation frequency by changing, based on the first control signal, a capacitance value of the variable capacitive element; a second tuning circuit configured to include a capacitive element and a first transistor whose first source or first drain is connected to the capacitive element, receive a second control signal and switch the capacitive element in and out of parallel connection with the inductor by turning on and off the first transistor based on the second control signal, to tune the oscillation frequency; and a switching circuit configured to include at least one n-channel second transistor whose second drain is connected via a resistor element to the first source or the first drain and a power and whose second source is grounded, and change a bias voltage of the second tuning circuit by turning on and off the at least one n-channel second transistor based on the second control signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Several embodiments will be described below with reference to the accompanying drawings, wherein like reference numerals refer to like elements throughout.

1. First Embodiment

Figure 1:
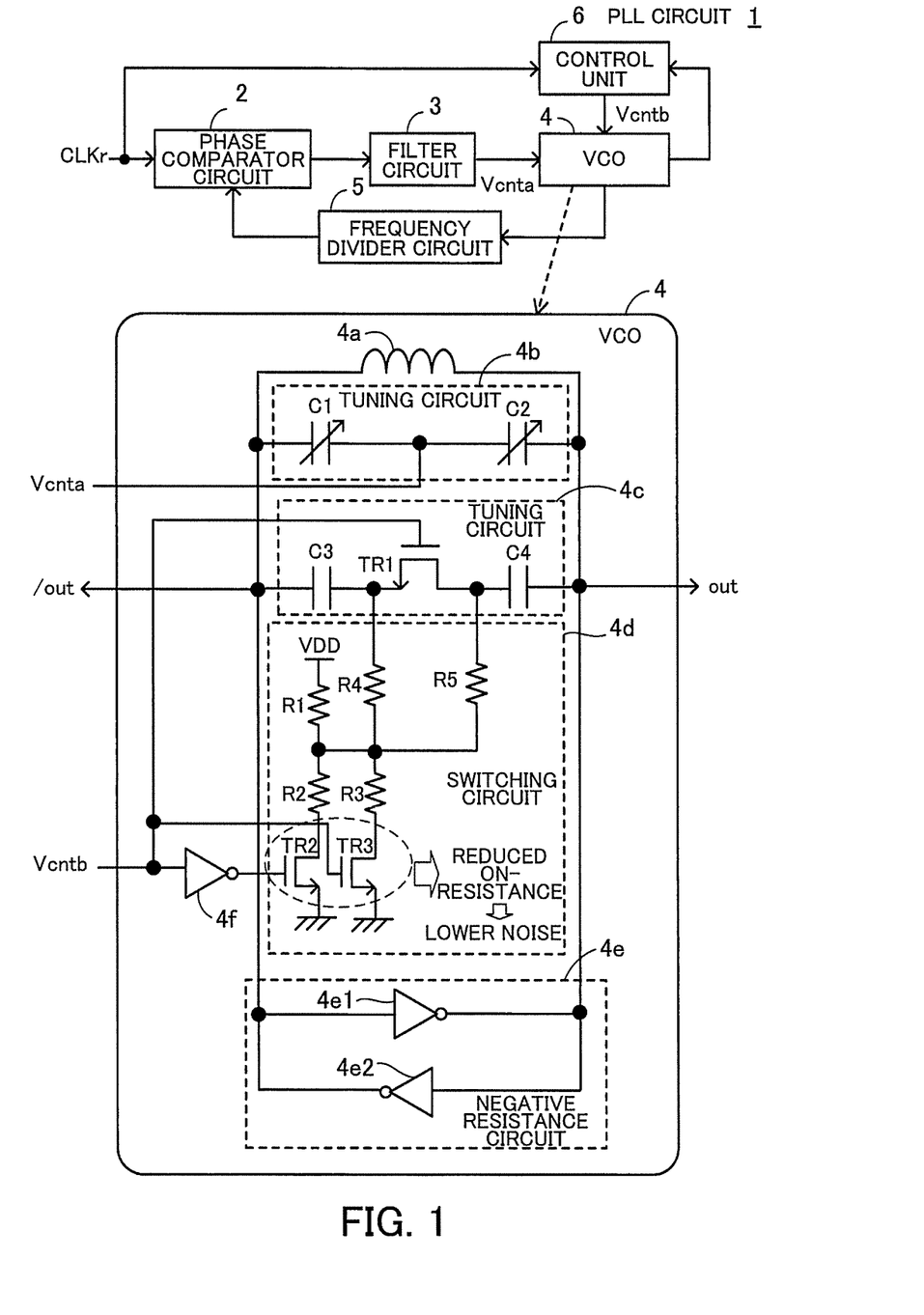
FIG. 1 illustrates an example of a PLL circuit and VCO according to a first embodiment.

FIG. 1 illustrates an example of a PLL circuit and VCO according to a first embodiment.

A PLL circuit 1 of the first embodiment is used, for example, in a serializer/deserializer (SerDes) included in a high-speed interface circuit. The PLL circuit 1 includes a phase comparator circuit 2, a filter circuit 3, a VCO 4, a frequency divider circuit 5, and a control unit 6.

The phase comparator circuit 2 outputs a phase difference signal representing the phase difference between a reference signal CLKr and a feedback signal output from the frequency divider circuit 5. The reference signal CLKr is, for example, a clock signal of a predetermined frequency, and generated by a reference signal generation circuit (not illustrated), such as a crystal oscillator.

The filter circuit 3 smoothes the phase difference signal to generate a control signal Vcnta, which is then output therefrom.

The VCO 4 outputs an output signal having a frequency tuned (oscillation frequency) based on the control signal Vcnta and a control signal Vcntb supplied by the control unit 6.

The frequency divider circuit 5 divides the frequency of the output signal of the VCO 4 to generate the above-mentioned feedback signal, which is then output therefrom. The frequency divider circuit 5 applies, for example, 1/N frequency division to the output signal. The value of N may be changed.

Based on the reference signal CLKr and the output signal of the VCO 4, the control unit 6 generates the control signal Vcntb used to make an adjustment (coarse tuning) to the oscillation frequency of the VCO 4.

The VCO 4 of the first embodiment includes an inductor 4a, tuning circuits 4b and 4c, a switching circuit 4d, a negative resistance circuit 4e, and an inverter circuit 4f.

Electric potentials at both ends of the inductor 4a are output signals out and /out of the VCO 4. The output signals out and/out have phases different from each other by 180 degrees and, for example, one of the output signals out and/out is supplied to the frequency divider circuit 5.

The tuning circuit 4b includes variable capacitive elements C1 and C2 connected in parallel to the inductor 4a. The tuning circuit 4b receives the control signal Vcnta, and changes capacitance values of the variable capacitive elements C1 and C2 based on the control signal Vcnta to thereby tune the oscillation frequency.

The variable capacitive elements C1 and C2 are, for example, varactors (also called varicaps). One electrode of the variable capacitive element C1 is connected to one end of the inductor 4a while one electrode of the variable capacitive element C2 is connected to the other end of the inductor 4a. To the other electrodes of the variable capacitive elements C1 and C2, the control signal Vcnta is supplied. For example, if the control signal Vcnta has higher voltage, the variable capacitive elements C1 and C2 have smaller capacitance values. On the other hand, if the control signal Vcnta has lower voltage, the variable capacitive elements C1 and C2 have larger capacitance values.

The tuning circuit 4c functions as a coarse tuning circuit for tuning the oscillation frequency coarsely. The tuning circuit 4c includes capacitive elements C3 and C4 and a transistor TR1 whose source and drain are respectively connected to the capacitive elements C3 and C4. The tuning circuit 4c receives the control signal Vcntb, and switches the capacitive elements C3 and C4 in and out of parallel connection with the inductor 4a by turning the transistor TR1 on and off based on the control signal Vcntb, to thereby tune the oscillation frequency.

The capacitance values of the capacitive elements C3 and C4 are fixed. One electrode of the capacitive element C3 is connected to one end of the inductor 4a while one electrode of the capacitive element C4 is connected to the other end of the inductor 4a. The other electrodes of the capacitive elements C3 and C4 are respectively connected to either the source or drain of the transistor TR1, and also receive a bias voltage from the switching circuit 4d.

The transistor TR1 is an n-channel metal-oxide semiconductor field-effect transistor (MOSFET). The transistor TR1 is turned on when the control signal Vcntb supplied to the gate of the transistor TR1 is at "H" (high) logic level (assume in the following that "H" logic level is equal to a power supply voltage Vdd). On the other hand, the transistor TR1 is turned off when the control signal Vcntb supplied to the gate is at "L" (low) logic level (assume in the following that "L" logic level is equal to 0 V).

Achieving a wide range of oscillation frequency only via tuning of the variable capacitive elements C1 and C2 results in increasing $K_{VCO}$ [Hz/V] which is the gain of the VCO 4. In that case, noise of the variable capacitive elements C1 and C2 is amplified by $K_{VCO}$, thus raising output noise. In view of this, the tuning circuit 4c above is employed in this embodiment.

The switching circuit 4d includes transistors TR2 and TR3 and resistor elements R1, R2, R3, R4, and R5. The transistors TR2 and TR3 are n-channel MOSFETs.

The drain of the transistor TR2 is connected via the resistor elements R1 and R2 to power VDD. The drain of the transistor TR2 is also connected via the resistor elements R2 and R4 to one of the source and drain of the transistor TR1 and one electrode of the capacitive element C3. Further, the drain of the transistor TR2 is connected via the resistor elements R2 and R5 to the other one of the source and drain of the transistor TR1 and one electrode of the capacitive element C4. To the gate of the transistor TR2, the control signal Vcntb is supplied via the inverter circuit 4f. The source of the transistor TR2 is grounded.

The drain of the transistor TR3 is connected via the resistor elements R1 and R3 to the power VDD. The drain of the transistor TR3 is also connected via the resistor elements R3 and R4 to one of the source and drain of the transistor TR1 and one electrode of the capacitive element C3. Further, the drain of the transistor TR3 is connected via the resistor elements R3 and R5 to the other one of the source and drain of the transistor TR1 and one electrode of the capacitive element C4. To the gate of the transistor TR3, the control signal Vcntb is supplied. The source of the transistor TR3 is grounded.

The switching circuit 4d switches on and off the transistors TR2 and TR3 based on the control signal Vcntb, to thereby change the bias voltage of the tuning circuit 4c.

For example, when the control signal Vcntb is at "H" logic level, the transistor TR2 is turned off while the transistor TR3 is turned on. By means of this, the power supply voltage Vdd supplied by the power VDD is divided between the resistor elements R1 and R3 to generate a bias voltage.

On the other hand, when the control signal Vcntb is at "L" logic level, the transistor TR2 is turned on while the transistor TR3 is turned off. By means of this, the power supply voltage Vdd is divided between the resistor elements R1 and R2 to generate a bias voltage.

Note here that, when the control signal Vcntb is at "L" logic level, the transistor TR1 of the tuning circuit 4c is turned off. Because the negative resistance circuit 4e is provided, the output signals out and/out substantially fully swing from a ground potential to a power supply potential. In order to prevent the transistor TR1 from being damaged by the output signals out and/out with such behavior, it is preferable to set the electric potentials at the source and drain of the transistor TR1 to approximately Vdd/2 in consideration of the dielectric strength of the transistor TR1. Therefore, the resistor elements R1 and R2 preferably have equal resistance values. The resistance value of the resistor element R3 may be less than those of the resistor elements R1 and R2. When the resistance value of the resistor element R3 is R, the resistance values of the resistor elements R1 and R2 are set to 9R, for example.

Note that, in the VCO 4, the resistor elements R4 and R5 and the capacitive elements C3 and C4 make up a filter circuit. The resistance values of the resistor elements R4 and R5 are set according to a frequency used by the PLL circuit 1 so that the filter circuit passes a signal having the frequency.

The negative resistance circuit 4e is connected in parallel to the inductor 4a, and has a function of compensating losses occurring in an LC resonant circuit composed of the inductor 4a and the tuning circuits 4b and 4c. The negative resistance circuit 4e includes inverter circuits 4e1 and 4e2 constructed using complementally metal-oxide semiconductor (CMOS) transistors (not illustrated). The output terminal of the inverter circuit 4e1 is connected to the input terminal of the inverter circuit 4e2, and the output terminal of the inverter circuit 4e2 is connected to the input terminal of the inverter circuit 4e1. Such a connection configuration is sometimes referred to as cross-coupling of CMOS transistors. Note that the configuration of the negative resistance circuit 4e is not limited to using cross-coupling of CMOS transistors, and the negative resistance circuit 4e is formed, for example, by cross-coupling of either n-channel or p-channel MOSFETs.

Next described is an example of an operation of the PLL circuit 1 of this embodiment.

The PLL circuit 1 coarsely tunes the oscillation frequency using the tuning circuit 4c, and then tunes the oscillation frequency to a target value using the tuning circuit 4b. For example, in the case where the frequency of the reference signal CLKr is fr which is to be divided to 1/N by the frequency divider circuit 5, the target value is N×fr.

When the oscillation frequency is denoted by f, f is represented by Equation (1) below:

$$f=1/(2n(LC)^{1/2}) \quad (1).$$

In Equation (1), L is the inductance value of the inductor 4a, and C is a combined capacitance value of the tuning circuits 4b and 4c.

When the control signal Vcntb is at "L" logic level, the transistor TR1 of the tuning circuit 4c is turned off and the combined capacitance value becomes smaller than when the transistor TR1 is turned on. As a result, the oscillation frequency obtained by Equation (1) is higher than when the transistor TR1 is turned on.

On the other hand, when the control signal Vcntb is at "H" logic level, the transistor TR1 of the tuning circuit 4c is turned on and the combined capacitance value becomes larger than when the transistor TR1 is turned off. As a result, the oscillation frequency obtained by Equation (1) is lower than when the transistor TR1 is turned off.

For example, while the control signal Vcnta is fixed to Vdd/2, the control unit 6 determines that the frequency of the output signal of the VCO 4 approximates better the target value either when the control signal Vcntb is at "H" or "L" logic level.

Then, the control unit 6 selects, between the "H" and "L" logic levels, one at which the frequency of the output signal of the VCO 4 has closely approximated the target value and fixes the control signal Vcntb at the selected logic level.

Subsequently, the tuning circuit 4b in the VCO 4 functions to tune the frequencies of the output signals out and/out to the above-mentioned target value.

In the frequency tuning described above, the switching circuit 4d switches the bias voltage to be applied to the transistor TR1 according to the logic level of the control signal Vcntb as described above in order to protect the transistor TR1.

In the switching circuit 4d of the VCO 4 according to this embodiment, the transistors TR2 and TR3 for changing the bias voltage are grounded on their source sides. This causes the gate-to-source voltage to be the power supply voltage Vdd, namely to be higher than the following comparative example of VCO, when the transistors TR1 or TR2 is turned on. This results in reduced on-resistance. The reduced on-resistance causes reduced thermal noise transferring to the output signals out and/out of the VCO4 via the capacitive elements C3 and C4 of the tuning circuit 4c. Accordingly, it is possible to control the output noise.

2. Comparative Example

Figure 2:
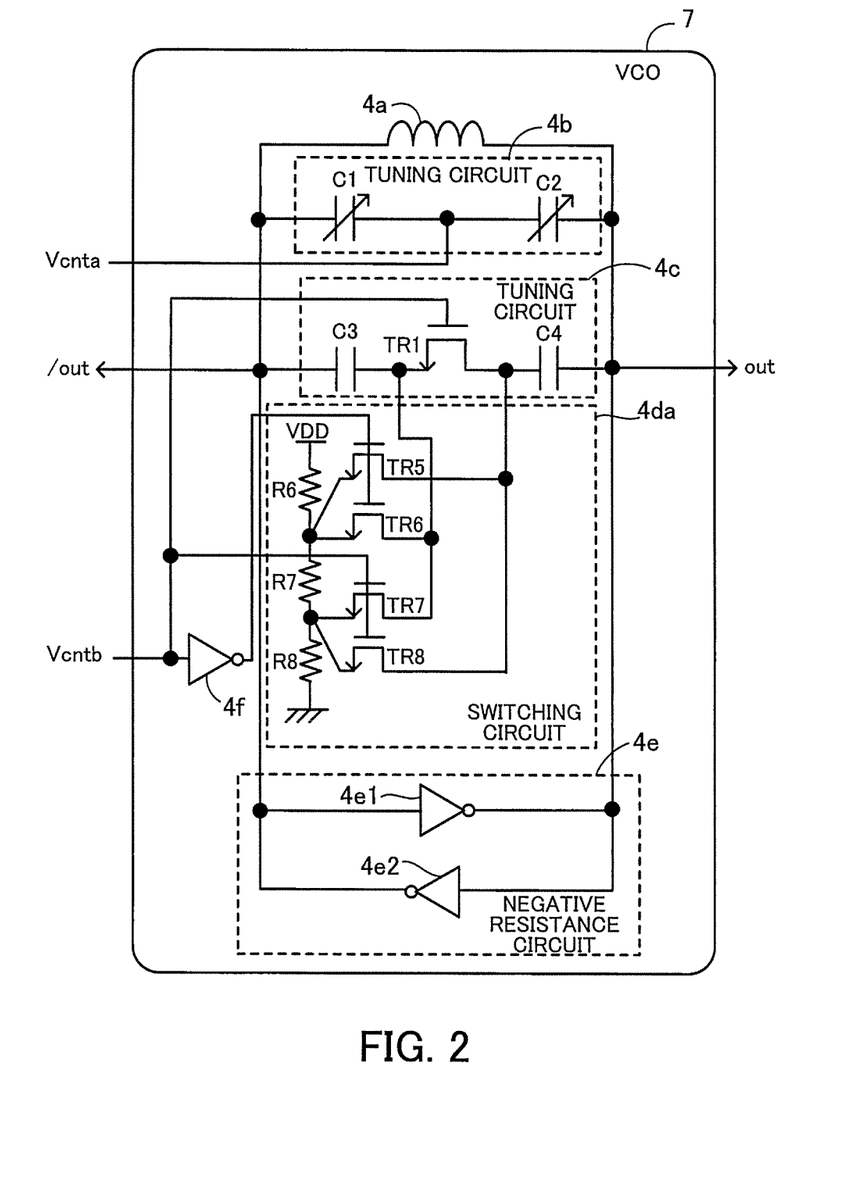
FIG. 2 illustrates a VCO of a comparative example.

FIG. 2 illustrates a VCO of a comparative example.

In FIG. 2, like reference numerals refer to identical components depicted in FIG. 1.

A VCO 7 in FIG. 2 includes a switching circuit 4da which differs from the switching circuit 4d of the VCO 4 in FIG. 1.

The switching circuit 4da includes transistors TR5, TR6, TR7, and TR8 and resistor elements R6, R7, and R8. The transistor TR5 to TR8 are n-channel MOSFETs.

The resistor elements R6 to R8 are connected in series between the power VDD and the ground.

As for each of the transistors TR5 and TR6, one of the source and drain is connected to a point between the resistor elements R6 and R7. The other one of the source and drain of the transistor TR5 is connected to one of the source and drain of the transistor TR1 and one electrode of the capacitive element C4. The other one of the source and drain of the transistor TR6 is connected to the other one of the source and drain of the transistor TR1 and one electrode of the capacitive element C3. To the gate of each of the transistors TR5 and TR6, the control signal Vcntb is supplied via the inverter circuit 4f.

As for each of the transistors TR7 and TR8, one of the source and drain is connected to a point between the resistor elements R7 and R8. The other one of the source and drain of the transistor TR7 is connected to one of the source and drain of the transistor TR1 and one electrode of the capacitive element C3. The other one of the source and drain of the transistor TR8 is connected to the other one of the source and drain of the transistor TR1 and one electrode of the capacitive element C4. The control signal Vcntb is supplied to the gate of each of the transistors TR7 and TR8.

The switching circuit 4da switches on and off the transistors TR5 to TR8 based on the control signal Vcntb, to thereby change the bias voltage of the tuning circuit 4c.

For example, when the control signal Vcntb is at "H" logic level, the transistors TR5 and TR6 are turned off while the transistors TR7 and TR8 are turned on. By means of this, the power supply voltage Vdd supplied by the power VDD is divided among the resistor elements R6 to R8 to generate a bias voltage. Assuming that the resistance value of the resistor element R8 is R, the resistance value of the resistor element R6 is 5R, and the resistance value of the resistor element R7 is 4R, the bias voltage is Vdd/10 when the control signal Vcntb is at "H" logic level.

On the other hand, when the control signal Vcntb is at "L" logic level, the transistors TR5 and TR6 are turned on while the transistors TR7 and TR8 are turned off. By means of this, the power supply voltage Vdd is divided among the resistor elements R6 to R8 to generate a bias voltage. Assuming that the resistance value of the resistor element R8 is R, the resistance value of the resistor element R6 is 5R, and the resistance value of the resistor element R7 is 4R, the bias voltage is Vdd/2 when the control signal Vcntb is at "L" logic level.

Herewith, it is possible to prevent the transistor TR1 of the tuning circuit 4c from being damaged by the output signals out and/out when the control signal Vcntb is at "L" logic level and the transistor TR1 is turned off.

However, when the control signal Vcntb is at "L" logic level and the resistor elements R6 to R8 have resistance values in the above-mentioned relationship, the gate-to-source voltage of each of the transistors TR5 and TR6 is Vdd/2. This causes the transistors TR5 and TR6 to have higher on-resistance compared to when the gate-to-source voltage is equal to the power supply voltage Vdd, resulting in increased thermal noise.

Compared to the VCO 7 of FIG. 2, the VCO 4 of FIG. 1 has the transistors TR2 and TR3 for changing the bias voltage being grounded on their source sides, thereby reducing on-resistance, which in turn contributes to a reduction in the output noise.

Figure 3:
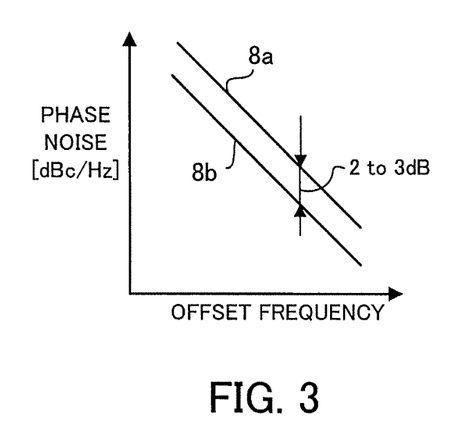
FIG. 3 illustrates an example of phase noise characteristics of the VCO according to the first embodiment and the VCO of the comparative example.

FIG. 3 illustrates an example of phase noise characteristics of the VCO according to the first embodiment and the VCO of the comparative example. The horizontal axis is the offset frequency (the deviation from the target value of the oscillation frequency). The vertical axis is the phase noise (dBc/Hz).

In FIG. 3, a characteristic 8a represents a phase noise characteristic of the VCO 7 of the comparative example depicted in FIG. 2 while a characteristic 8b represents a phase noise characteristic of the VCO 4 depicted in FIG. 1. As illustrated in FIG. 3, the phase noise of the VCO 4 according to the first embodiment is about 2 to 3 dB less than that of the VCO 7 of the comparative example.

3. Second Embodiment

Figure 4:
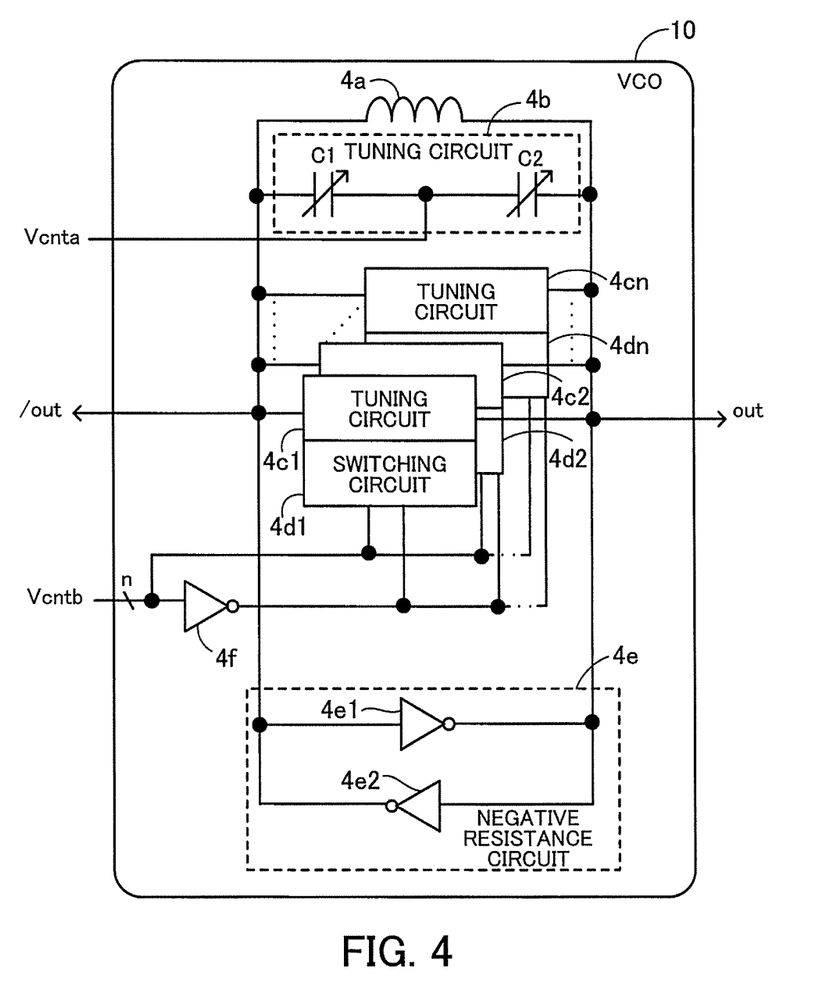
FIG. 4 illustrates an example of a VCO according to a second embodiment.

FIG. 4 illustrates an example of a VCO according to a second embodiment. In FIG. 4, like reference numerals refer to identical components of the VCO 4 depicted in FIG. 1.

A VCO 10 of the second embodiment includes a plurality of tuning circuits 4c1, 4c2, 4cn and a plurality of switching circuits 4d1, 4d2, . . . , 4dn each for changing the bias voltage of the corresponding one of the tuning circuits 4c1 to 4cn.

Although not illustrated in FIG. 4, each of the tuning circuits 4c1 to 4cn has the same configuration as the tuning circuit 4c of FIG. 1. Note however that it is possible to separately switch on and off respective transistors of the tuning circuits 4c1 to 4cn, each corresponding to the transistor TR1 of the tuning circuit 4c, using the control signal Vcntb in n bits.

Although not illustrated in FIG. 4, each of the switching circuits 4d1 to 4dn has the same configuration as the switching circuit 4d of FIG. 1. Note however that it is possible to separately turn on and off respective transistors of the switching circuits 4d1 to 4dn, corresponding to the transistors TR2 and TR3 of the switching circuit 4d, using the n-bit control signal Vcntb.

Different capacitance values are assigned to capacitive elements in each of the tuning circuits 4c1 to 4cn, thereby variously changing the combined capacitance value formed together with the capacitance values of the variable capacitive elements C1 and C2 of the tuning circuit 4b according to the control signal Vcntb. This allows tuning of the oscillation frequency over a wider range.

In addition, the switching circuits 4d1 to 4dn, each equivalent to the switching circuit 4d of FIG. 1, are provided for the tuning circuits 4c1 to 4cn, respectively, which not only prevents the transistors from being damaged but also controls the output noise.

For example, in the case where the switching circuit 4da of FIG. 2 is utilized as each of the switching circuits 4d1 to 4dn, the output noise may increase with a greater number of the switching circuits 4d1 to 4dn. On the other hand, if the switching circuit 4d of FIG. 1 is used as each of the switching circuits 4d1 to 4dn, an increase in the output noise is controlled even when the switching circuits 4d1 to 4dn are increased in number.

4. Third Embodiment

Figure 5:
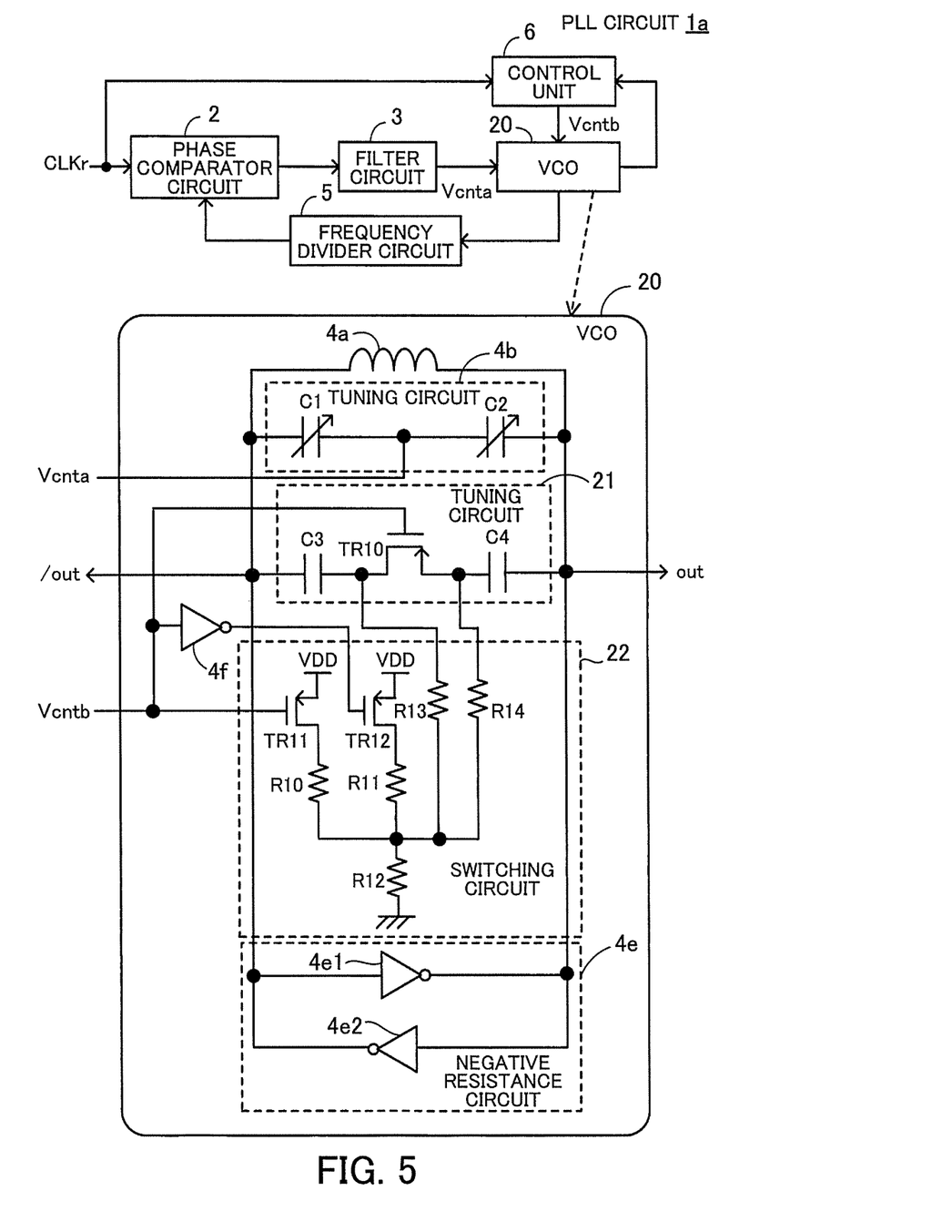
FIG. 5 illustrates an example of a PLL circuit and VCO according to a third embodiment.

FIG. 5 illustrates an example of a PLL circuit and VCO according to a third embodiment. In FIG. 5, like reference numerals refer to identical components of the PLL circuit 1 and the VCO 4 depicted in FIG. 1.

A tuning circuit 21 of a VCO 20 in a PLL circuit 1a according to the third embodiment differs from the tuning circuit 4c of the VCO 4 in FIG. 1 according to the first embodiment in using a transistor TR10 which is a p-channel MOSFET.

In addition, a switching circuit 22 of the VCO 20 according to the third embodiment differs from the switching circuit 4d of the VCO 4 in FIG. 1 according to the first embodiment in using transistors TR11 and TR12 which are p-channel MOSFETs.

The source of each of the transistors TR11 and TR12 is connected to the power VDD. The drain of the transistor TR11 is grounded via resistor elements R10 and R12. The drain of the transistor TR11 is also connected via the resistor element R10 and a resistor element R13 to one of the source and drain of the transistor TR10 and one electrode of the capacitive element C3 in the tuning circuit 21. Further, the drain of the transistor TR11 is connected via the resistor element R10 and a resistor element R14 to the other one of the source and drain of the transistor TR10 and one electrode of the capacitive element C4. To the gate of the transistor TR11, the control signal Vcntb is supplied. The bias voltage is applied to the above-mentioned one electrode of the capacitive element C3 and the above-mentioned one electrode of the capacitive element C4 by the switching circuit 22.

The drain of the transistor TR12 is connected via the resistor elements R11 and R13 to one of the source and drain of the transistor TR10 and one electrode of the capacitive element C3. The drain of the transistor TR12 is connected via the resistor elements R11 and R14 to the other one of the source and drain of the transistor TR10 and one electrode of the capacitive element C4. To the gate of the transistor TR12, the control signal Vcntb is supplied via the inverter circuit 4f.

The switching circuit 22 switches on and off the transistors TR11 and TR12 based on the control signal Vcntb, to thereby change the bias voltage of the tuning circuit 21.

For example, when the control signal Vcntb is at "H" logic level, the transistor TR11 is turned off while the transistor TR12 is turned on. By means of this, the power supply voltage Vdd supplied by the power VDD is divided between the resistor elements R11 and R12 to generate a bias voltage.

On the other hand, when the control signal Vcntb is at "L" logic level, the transistor TR11 is turned on while the transistor TR12 is turned off. By means of this, the power supply voltage Vdd is divided between the resistor elements R10 and R12 to generate a bias voltage.

Note here that, when the control signal Vcntb is at "H" logic level, the transistor TR10 of the tuning circuit 21 is turned off. In this regard, it is preferable to set the electric potentials at the source and drain of the transistor TR10 to approximately Vdd/2 in order to prevent the transistor TR10 from being damaged by the output signals out and/out. Therefore, the resistor elements R11 and R12 preferably have equal resistance values. The resistance value of the resistor element R10 may be less than those of the resistor elements R11 and R12. When the resistance value of the resistor element R10 is R, the resistance values of the resistor elements R11 and R12 are set to 9R, for example.

Note that, in the VCO 20, the resistor elements R13 and R14 and the capacitive elements C3 and C4 make up a filter circuit. The resistance values of the resistor elements R13 and R14 are set according to a frequency used in the PLL circuit 1 in which the VCO 20 is implemented so that the filter circuit passes a signal having the frequency.

In the switching circuit 22 of the VCO 20 according to this embodiment, the sources of the transistors TR11 and TR12, which are p-channel MOSFETs for switching the bias voltage, are connected to the power VDD. This causes the gate-to-source voltage to be high when the transistor TR11 or TR12 is turned on, which results in reduced on-resistance. As a result, it is possible to control the output noise of the VCO 20. Thus, the VCO 20 according to the third embodiment, in which p-channel MOSFETs are used in place of n-channel MOSFETs, achieves the same effect as that of the VCO 4 according to the first embodiment.

In the case where, for example, the negative resistance circuit 4e is created using only p-channel MOSFETs, adopting the VCO 20 according to the third embodiment facilitates the manufacturing process.

Note that, needless to say, the tuning circuit 21 and the switching circuit 22 of FIG. 5 may individually be provided in plurality in the VCO 20 as is the case with the VCO 10 according to the second embodiment.

Having described aspects of the VCOs and PLL circuits based on the embodiments above, they are merely examples and the particular details of these illustrative examples shall not be construed as limitations on the appended claims.

According to the voltage controlled oscillators and PLL circuits disclosed herein, it is possible to control the output noise.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A voltage controlled oscillator comprising:
an inductor;
a first tuning circuit configured to include a variable capacitive element connected in parallel to the inductor, and receive a first control signal and tune an oscillation frequency by changing, based on the first control signal, a capacitance value of the variable capacitive element;
a second tuning circuit configured to include a capacitive element and a first transistor whose first source or first drain is connected to the capacitive element, receive a second control signal and switch the capacitive element in and out of parallel connection with the inductor by turning on and off the first transistor based on the second control signal, to tune the oscillation frequency; and
a switching circuit configured to include at least one n-channel second transistor whose second drain is electrically connected via at least one first resistor element to the first source or the first drain and electrically connected via the at least one first resistor element and a second resistor element to a power source and whose second source is grounded, and change a bias voltage of the second tuning circuit by turning on and off the at least one n-channel second transistor based on the second control signal.

2. The voltage controlled oscillator according to claim 1, wherein in the switching circuit, the at least one n-channel second transistor includes two n-channel second transistors, the at least one first resistor element includes a third resistor element and a fourth resistor element, each of the two n-channel second transistors is electrically connected via the third resistor element or the fourth resistor element to the first source or the first drain and electrically connected via the second resistor element and the third resistor element or the fourth resistor element to the power source, and one of the two n-channel second transistors is turned on when the first transistor is turned off based on the second control signal.

3. The voltage controlled oscillator according to claim 1, wherein
the second tuning circuit is provided in plurality, in each of which the first transistor is individually turned on and off based on the second control signal in a plurality of bits, and
the switching circuit is provided in plurality which correspond one-to-one with the plurality of second tuning circuits.

4. A voltage controlled oscillator comprising:
an inductor;
a first tuning circuit configured to include a variable capacitive element connected in parallel to the inductor, and receive a first control signal and tune an oscillation frequency by changing, based on the first control signal, a capacitance value of the variable capacitive element;
a second tuning circuit configured to include a capacitive element and a first transistor whose first source or first drain is connected to the capacitive element, receive a second control signal and switch the capacitive element in and out of parallel connection with the inductor by turning on and off the first transistor based on the second control signal, to tune the oscillation frequency; and
a switching circuit configured to include at least one p-channel second transistor whose second drain is electrically connected via a first resistor element to the first source or the first drain and is electrically connected to ground via the first resistor element and a second resistor element and whose second source is connected to a power source, and change a bias voltage of the second tuning circuit by turning on and off the at least one p-channel second transistor based on the second control signal.

5. A PLL circuit comprising:
a voltage controlled oscillator configured to include an inductor, a first tuning circuit which includes a variable capacitive element connected in parallel to the inductor, and receives a first control signal and tunes an oscillation frequency by changing, based on the first control signal, a capacitance value of the variable capacitive element, a second tuning circuit which includes a capacitive element and a first transistor whose first source or first drain is connected to the capacitive element, receives a second control signal and switches the capacitive element in and out of parallel connection with the inductor by turning on and off the first transistor based on the second control signal, to tune the oscillation frequency, and a switching circuit which includes at least one n-channel second transistor whose second drain is electrically connected via a first resistor element to the first source or the first drain and electrically connected via the at least one first resistor element and a second resistor element to a power source and whose second source is grounded, and changes a bias voltage of the second tuning circuit by turning on and off the at least one n-channel second transistor based on the second control signal;

a frequency divider circuit configured to divide a frequency of an output signal of the voltage controlled oscillator to generate a feedback signal and output the feedback signal;

a phase comparator circuit configured to output a phase difference signal representing phase difference between the feedback signal and a reference signal;

a filter circuit configured to generate the first control signal by smoothing the phase difference signal and output the first control signal; and a control unit configured to generate the second control signal based on the reference signal and the output signal of the voltage controlled oscillator and output the second control signal.

6. A PLL circuit comprising:

a voltage controlled oscillator configured to include an inductor, a first tuning circuit which includes a variable capacitive element connected in parallel to the inductor, and receives a first control signal and tunes an oscillation frequency by changing, based on the first control signal, a capacitance value of the variable capacitive element, a second tuning circuit which includes a capacitive element and a first transistor whose first source or first drain is connected to the capacitive element, receives a second control signal and switches the capacitive element in and out of parallel connection with the inductor by turning on and off the first transistor based on the second control signal, to tune the oscillation frequency, and a switching circuit which includes at least one p-channel second transistor whose second drain is electrically connected via a first resistor element to the first source or the first drain and is electrically connected to ground via the first resistor element and a second resistor element and whose second source is connected to a power source, and changes a bias voltage of the second tuning circuit by turning on and off the at least one p-channel second transistor based on the second control signal;

a frequency divider circuit configured to divide a frequency of an output signal of the voltage controlled oscillator to generate a feedback signal and output the feedback signal;

a phase comparator circuit configured to output a phase difference signal representing phase difference between the feedback signal and a reference signal;

a filter circuit configured to generate the first control signal by smoothing the phase difference signal and output the first control signal; and a control unit configured to generate the second control signal based on the reference signal and the output signal of the voltage controlled oscillator and output the second control signal.

\* \* \* \* \*